United States Patent
Takeuchi (10) Patent No.: US 7,098,080 B2
(45) Date of Patent: Aug. 29, 2006

(54) METHOD OF MAKING A SEMICONDUCTOR PACKAGE WITH INTEGRATED HEAT SPREADER ATTACHED TO A THERMALLY CONDUCTIVE SUBSTRATE CORE

(75) Inventor: Timothy M. Takeuchi, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/335,347

(22) Filed: Jan. 18, 2006

(65) Prior Publication Data

US 2006/0114656 A1    Jun. 1, 2006

Related U.S. Application Data

(62) Division of application No. 10/038,806, filed on Jan. 2, 2002.

(51) Int. Cl.
*H01L 21/48*    (2006.01)

(52) U.S. Cl. ...................... 438/122; 438/125

(58) Field of Classification Search ............ 438/122, 438/125
See application file for complete search history.

(56) References Cited

U.S. PATENT DOCUMENTS

| | | | |
|---|---|---|---|
| 4,561,011 A | 12/1985 | Kohara et al. | |
| 5,397,917 A | 3/1995 | Ommen et al. | |
| 5,410,449 A | 4/1995 | Brunner | |
| 5,586,006 A | 12/1996 | Sevama et al. | |
| 5,720,342 A | 2/1998 | Owens et al. | |
| 5,786,630 A | 7/1998 | Bhansali et al. | |
| 5,866,943 A | 2/1999 | Mertol | |
| 5,883,425 A | 3/1999 | Kobayashi | |
| 5,886,406 A | 3/1999 | Bhansali | |
| 5,990,552 A | 11/1999 | Xie et al. | |
| 6,118,177 A | 9/2000 | Lischner et al. | |
| 6,178,093 B1 | 1/2001 | Bhatt et al. | |
| 6,215,670 B1 | 4/2001 | Kahndros | |
| 6,229,204 B1 | 5/2001 | Hembree | |
| 6,281,573 B1 | 8/2001 | Atwood et al. | |
| 6,297,549 B1 | 10/2001 | Hiyoshi | |
| 6,362,522 B1 | 3/2002 | Ley | |
| 6,396,136 B1 | 5/2002 | Kalidas et al. | |

FOREIGN PATENT DOCUMENTS

| | | |
|---|---|---|
| JP | 59-65458 | 4/1984 |
| JP | 59-219942 | 12/1984 |

OTHER PUBLICATIONS

Mirng-Ji Lii et al., "Flip-Chip Technology on Organic Pin Grid Array Packages", Intel Technology Journal Q3, 2000, pp. 1-9.
Ravi Mahajan et al., "The Evolution of Microprocessor Package" Intel Technology Journal Q3, 2000, pp. 1-10.

*Primary Examiner*—Douglas W. Owens
(74) *Attorney, Agent, or Firm*—Blakely, Sokoloff, Taylor & Zafman LLP (57) ABSTRACT

A semiconductor package substrate has top and bottom surface buildup layers disposed on a thermally conductive substrate core. A portion of the substrate core may be exposed at a top surface of the package substrate to allow a heat spreader to be thermally coupled to the substrate core. An integrated circuit may be mounted on a top surface of the package substrate, with a top surface of the integrated circuit facing down. A heat spreader may be attached to the package substrate. The heat spreader may be thermally coupled to the substrate core and to a backside surface of the integrated circuit.

6 Claims, 7 Drawing Sheets

METHOD OF MAKING A SEMICONDUCTOR PACKAGE WITH INTEGRATED HEAT SPREADER ATTACHED TO A THERMALLY CONDUCTIVE SUBSTRATE CORE

This is a Divisional Application of Ser. No. 10/038,806, filed Jan. 2, 2002 which is presently pending.

FIELD OF THE INVENTION

The present invention relates to semiconductor package technology and more particularly to a semiconductor package having an integrated heat spreader.

BACKGROUND OF THE INVENTION

Within the integrated circuit industry there is a continuing effort to increase integrated circuit device density and speed. As integrated circuits become smaller, the number of interconnections and the amount of heat generated per square inch may increase accordingly. Increased heating of an integrated circuit device may affect the performance of the device and may cause permanent damage. Further, electromagnetic emissions may also increase with faster switching speeds which may increase the need for shielding to prevent electromagnetic interference (EMI) to adjacent or nearby devices and equipment. Semiconductor packages may be designed to address some of these issues.

For example, a flip chip package, also known as control collapse chip connection (C4) package, may accommodate interconnection requirements of high-density integrated circuits. In a typical flip chip package, an integrated circuit (a chip) may be mounted to the top surface of a package substrate that serves as an interconnection device. The package substrate typically consists of top and bottom surface buildup layers of interconnect circuitry disposed on a substrate core. As current is passed through the top and bottom buildup layers, heat may be generated, which may cause the package substrate to self-heat. The substrate core is typically made of an organic material that is not thermally conductive, and so acts as a thermal insulator to the buildup layer.

A current solution to remove heat from a flip chip package is to attach a heat spreader in thermal contact with a backside surface of the integrated circuit. The heat spreader is typically attached to a solder area around the perimeter of the top buildup layers. Because the solder resist area is not thermally conductive, there may be no path for heat transfer from a self-heated package substrate to the heat spreader. Therefore, the heat spreader may do little to remove heat from the self-heated package substrate. Further, because the solder resist area is not electrically conductive, the heat spreader may not be grounded and may not provide adequate EMI suppression.

DETAILED DESCRIPTION

The following detailed description sets forth an embodiment or embodiments in accordance with the present invention. In the following description, numerous specific details are set forth such as material types and ranges, in order to provide a thorough understanding of the present invention. However, it will be obvious to one of skill in the art, that the invention may be practiced without these specific details. In other instances, well-known elements and processing techniques have not been shown in particular detail in order to avoid unnecessarily obscuring the present invention.

According to one embodiment of the present invention, a heat spreader may be attached to a package substrate having a substrate core made of a thermally conductive material. The heat spreader may be thermally coupled to the substrate core. The thermally conductive material of the substrate core may provide a path for the transfer of heat from the package substrate to the heat spreader, which may help cool the package substrate.

Figure 1:
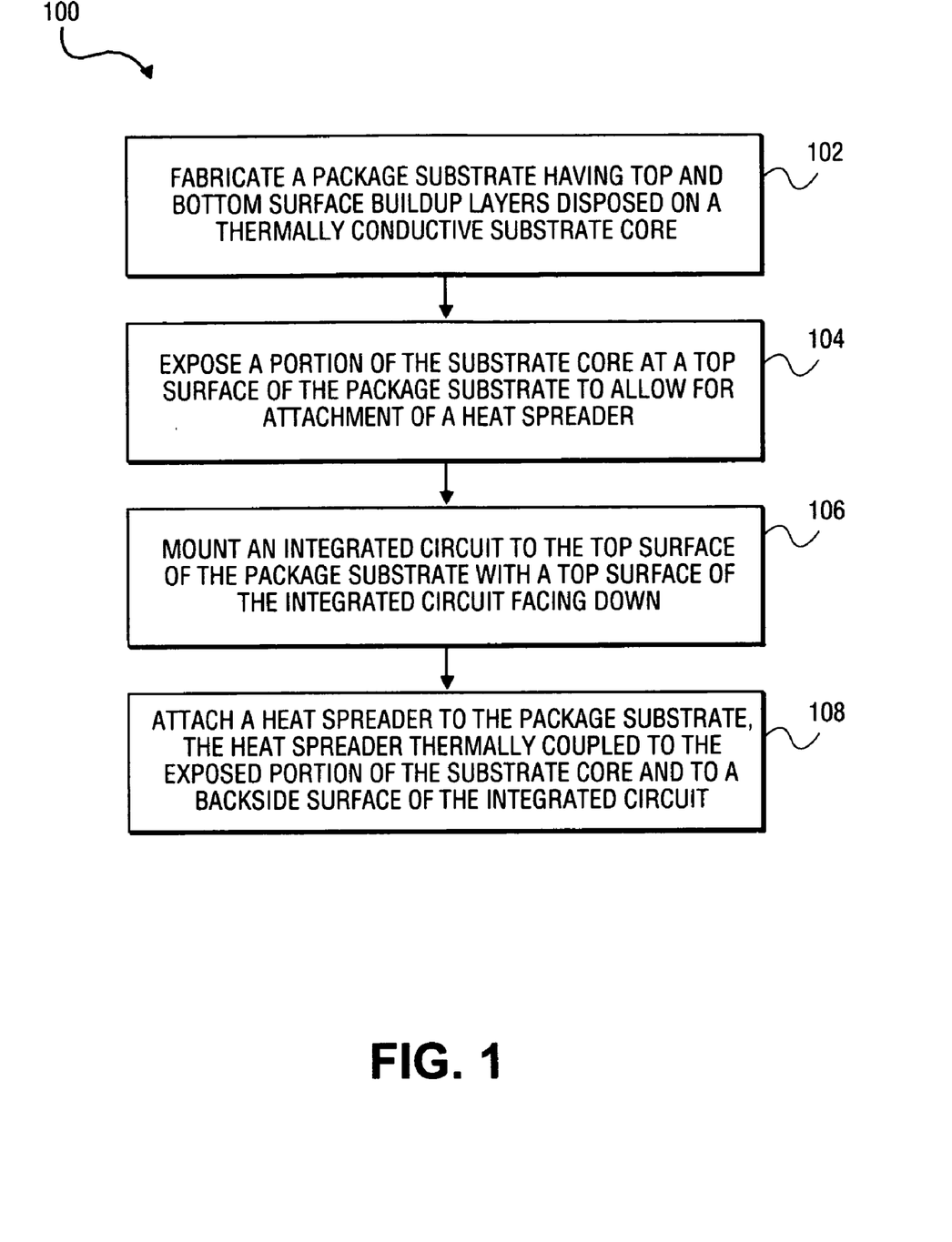
FIG. 1 illustrates a flow diagram of one embodiment of the present invention.

FIG. 1 illustrates a flow diagram 100 of a method to fabricate a semiconductor package according to one embodiment of the present invention. For block 102, a package substrate is fabricated having top and bottom surface buildup layers disposed on a thermally conductive substrate core. As previously described, a heat spreader is typically attached to a solder resist area of the top surface buildup layers. The solder resist may act as a thermal insulator, which may impede the flow of heat from the package substrate to the heat spreader. According to the present invention, however, a heat spreader may be thermally coupled to the thermally conductive substrate core. Therefore, for block 104, a portion of the substrate core is exposed at the top surface of the package substrate to allow for attachment of a heat spreader.

Figure 2:
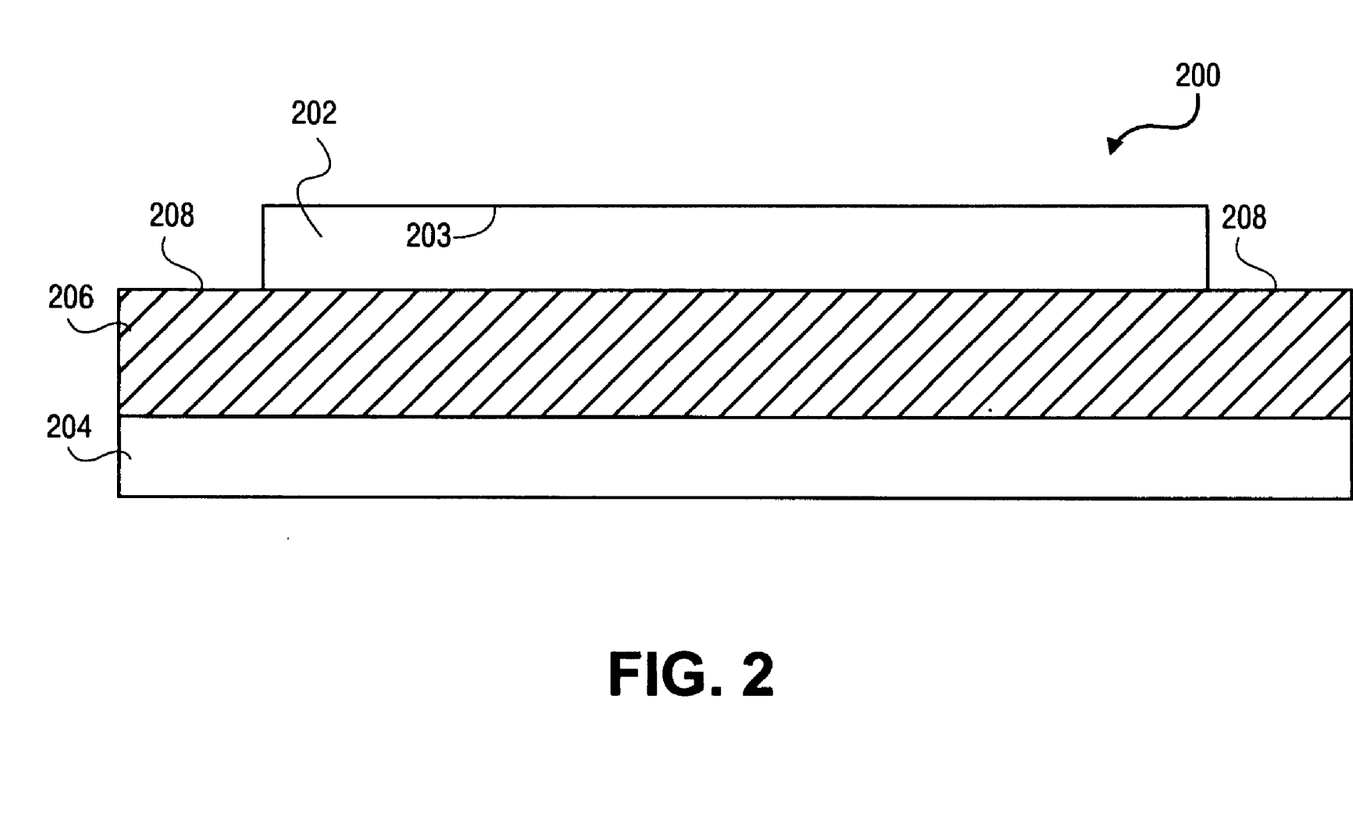
FIG. 2 illustrates a package substrate according to one embodiment of the present invention.

FIG. 2 illustrates an exemplary package substrate 200 in accordance with the operations of blocks 102 and 104 of FIG. 1. Package substrate 200 has top surface buildup layers 202, with a top surface 203, and bottom surface buildup layers 204 disposed on a substrate core 206. The substrate core may be made of any suitable thermally conductive material, such as metal or a thermally conductive composite material. For one embodiment, the substrate core may be made of copper. The top surface buildup layers may be formed over an entire top surface of the substrate core and then etched back to expose a portion 208 the substrate core. Alternatively, a portion of the substrate core may be masked while forming the top surface buildup layers on the substrate core, leaving the masked portion of the substrate core exposed.

Figure 3:
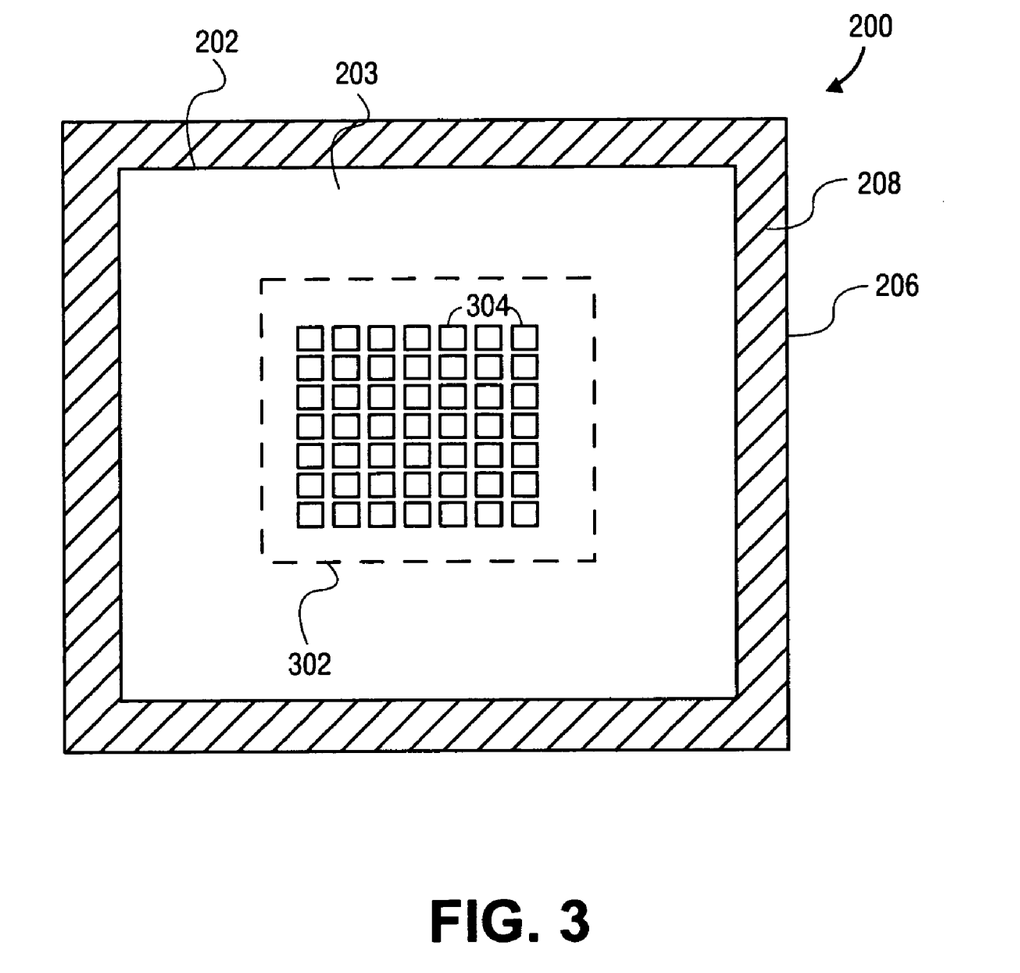
FIG. 3 illustrates a top view of a package substrate according to one embodiment of the present invention.

FIG. 3 illustrates a top view of the exemplary package substrate 200. As illustrated, for one embodiment, the exposed portion 208 of the substrate core 206 may extend around the perimeter of the top surface buildup layers 202. The shape and width of the exposed portion of the substrate core may vary with different embodiments. For example, the package substrate may be designed to expose a sufficiently large portion of the substrate core, while allowing a sufficiently large interconnect area 302 on the top surface 203 of the top surface buildup layers. The interconnect area may have a plurality of contact pads 304 to mechanically and electrically couple with corresponding contact pads of an integrated circuit. The buildup layers may comprise power planes, ground planes, and signal routing traces, interconnected by a plurality of vias (not shown) extending through the substrate core, to interconnect the contact pads on the top surface of the package substrate to contact pads (not shown) on a bottom surface of the package substrate.

For block 106 of FIG. 1, an integrated circuit is mounted to the top surface of the package substrate with a top surface of the integrated circuit facing down. For block 108, a heat spreader is attached to the package substrate, the heat spreader thermally coupled to the exposed portion of the substrate core and to a backside surface of the integrated circuit.

Figure 4:
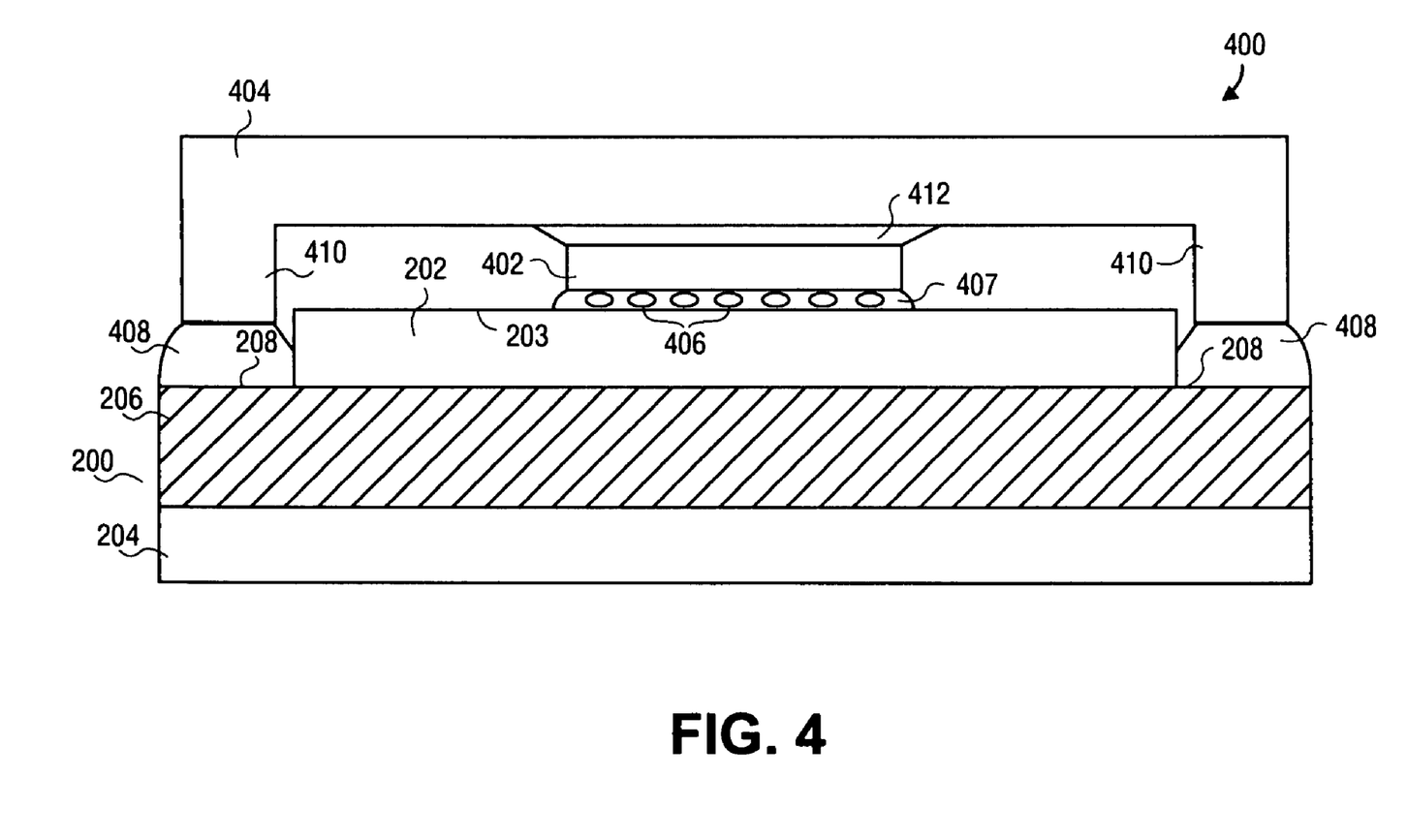
FIG. 4 illustrates a semiconductor package according to one embodiment of the present invention.

FIG. 4 illustrates an exemplary semiconductor package 400 in accordance with the operations of blocks 106 and 108 of FIG. 1. As illustrated, an integrated circuit 402 may be mounted on the package substrate 200 with a heat spreader 404 thermally coupled to the substrate core. The integrated circuit may be coupled electrically and mechanically to contact pads on the top surface of the package substrate via a plurality of solder bump interconnections 406, which may be controlled collapse chip connection (C4) connections. For one embodiment, an inter-fill material 407 may be disposed between the integrated circuit and the package substrate to provide mechanical support to protect the solder bump interconnections between the integrated circuit and the package substrate.

As illustrated, for one embodiment, the heat spreader may be thermally coupled to the substrate core with a thermally conductive solder 408. The solder may have a thermal conductivity, for example, in the range of 20 to 100 Watts per meter Kelvin (W/mK). For another embodiment, the heat spreader may be thermally coupled to the substrate core with a thermally conductive adhesive. The thermally conductive adhesive may have a thermal conductivity, for example, greater than 1 W/mK. The heat spreader may be made of any suitable thermally conductive material, such as a metal or a thermally conductive composite material. For example, the heat spreader may be copper or aluminum.

The heat spreader may be supported by standoffs 410, which may be integral to the heat spreader or may be separate components. The height of the standoffs may be selected to allow a small gap between the backside surface of the integrated circuit and a bottom surface of the heat spreader. The height of the gap may be controlled to ensure the bottom surface of the heat spreader does not directly contact the integrated circuit as the components expand and contract during thermal cycling, which may damage the integrated circuit. A thermal interface material 412 may be deposited to fill the gap in order to provide a path for heat transfer from the integrated circuit to the heat spreader. The thermal interface material may be a thermal grease, thermal epoxy, thermal paste, thermal gel, or any other suitable material.

Figure 5:
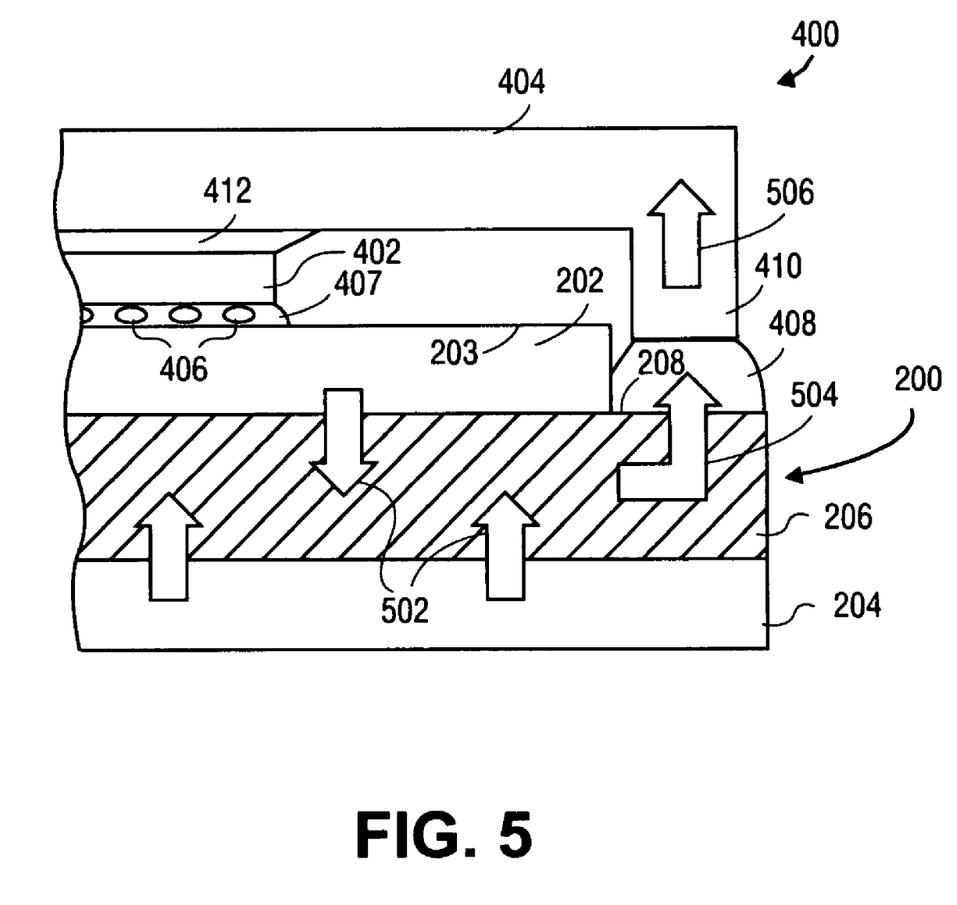
FIG. 5 illustrates a diagram of heat flow in a semiconductor package according to one embodiment of the present invention.

FIG. 5 illustrates, for one embodiment, a diagram of heat flow from the package substrate 200 to the heat spreader 404. As previously described, the substrate core 206 may be made of a thermally conductive material, such as a metal, which may provide a path for the transfer of heat from the buildup layers 202 and 204 to the heat spreader. For example, as current is passed through the buildup layers, heat generated at the buildup layers may be transferred to the substrate core, as illustrated by arrows 502. Heat may be transferred from the substrate core to the heat spreader, as illustrated by arrows 504 and 506, thereby removing heat from the package substrate.

Figure 6:
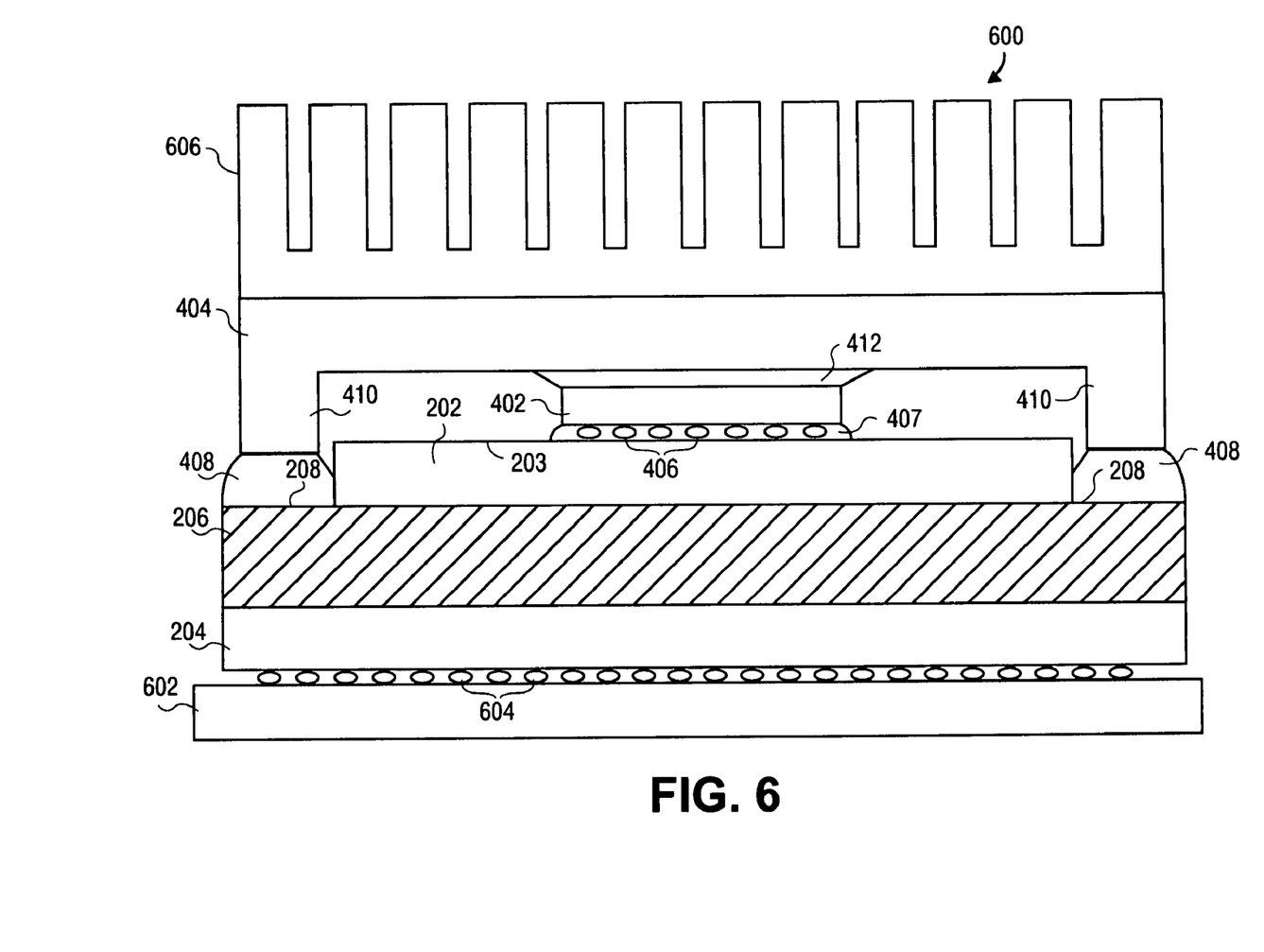
FIG. 6 illustrates a semiconductor package according to another embodiment of the present invention.

As illustrated in FIG. 6, for one embodiment, the semiconductor package may be mechanically and electrically coupled to a printed circuit board (PCB) 602 via a plurality of solder bump interconnections 604. For another embodiment, the semiconductor package may be mounted in a socket, for example, on a computer system motherboard, via a plurality of surface mount pins attached to the bottom surface of the package substrate.

A heat sink 606 may be attached to a top surface of the heat spreader to further assist with heat removal. The heat sink may be attached to the heat spreader, for example, by a clip, epoxy, or a thermal adhesive. The heat sink may include fins or other protrusions to increase its surface area, which may increase its ability to remove heat from the semiconductor package. The heat sink may be made of any suitable material, such as a metal or thermally conductive composite material. For example, the heat sink may be made of the same material as the heat spreader. For one embodiment, the heat sink may be integrated with the heat spreader. A small fan (not shown) may be added to the heat sink, making the heat sink an active component. Active heat sinks may be used to cool microprocessors, for example, by providing a dedicated air stream.

As described above, a single heat spreader attached directly to the substrate core may assist in removing heat from the package substrate and the integrated circuit. For another embodiment, however, a heat spreader may be attached directly to the substrate core to remove heat from the package substrate, while a separate heat spreader may be provided to remove heat from the integrated circuit. For one embodiment, the separate heat spreaders may be placed in thermal contact with each other.

Multi-Chip Module

For some applications, it may be desirable to include more than one integrated circuit in a single semiconductor package. Therefore, according to one embodiment, a multi-chip module may combine two or more integrated circuits on a single package substrate. A multi-chip module may integrate different functional blocks into a single package, which may enhance signal integrity and/or help meet interconnectivity requirements. For example, a multi-chip module may combine a plurality of integrated circuits that form a memory controller chip set into a single package.

Figure 7:
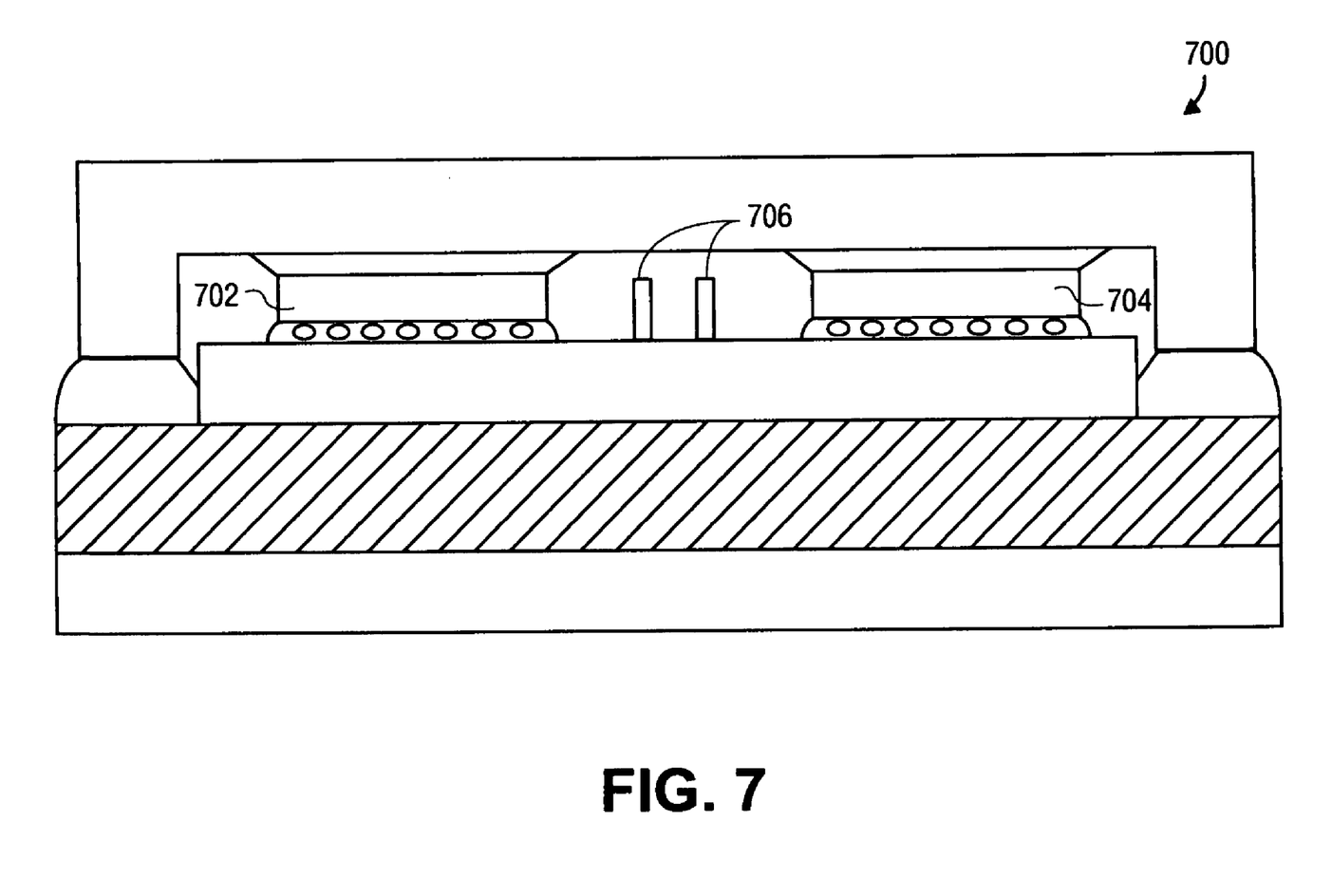
FIG. 7 illustrates a multi-chip module according to one embodiment of the present invention.

FIG. 7 illustrates a multi-chip module 700 according to one embodiment of the present invention. As illustrated, the multi-chip module may comprise more than one integrated circuit, such as integrated circuits 702 and 704. In addition to housing one or more integrated circuits, a semiconductor package may also house other electronic or electrical devices necessary for operation of the integrated circuit device. For example, decoupling capacitors 706 may also be mounted on the package substrate where they may be electrically coupled to the one or more integrated circuits. As illustrated, the present invention may accommodate the placement of electronic devices on the top surface of the package substrate. For one embodiment, electronic devices may be placed on a bottom surface of the package substrate.

EMI Suppression

The heat spreader and thermally conductive substrate core of the present invention may assist in suppressing electromagnetic emissions from a semiconductor device. For example, for one embodiment, a metal heat spreader and substrate core may form an electrically conductive enclosure that shields the integrated circuit(s) on all sides, which may reduce electromagnetic interference (EMI) to nearby components. EMI suppression may be especially important if electromagnetic emissions from the integrated circuit are in a frequency range that may interfere with communications equipment.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:

mounting an integrated circuit on a top surface of a package substrate having top and bottom surface buildup layers disposed on a thermally conductive substrate core, wherein a portion of the substrate core is exposed at the top surface of the package substrate; and attaching a heat spreader to the package substrate, the heat spreader thermally coupled to the exposed portion of the substrate core and to a backside surface of the integrated circuit.

2. The method of claim 1, wherein attaching the heat spreader comprises soldering the heat spreader to the exposed portion of the substrate core.

3. The method of claim 1, wherein mounting the integrated circuit comprises mechanically and electrically coupling the integrated circuit to the top surface of the package substrate by a plurality of solder bump interconnections.

4. The method of claim 1, wherein the exposed portion of the substrate core extends around the perimeter of the top surface buildup layers.

5. The method of claim 1, comprising depositing a thermal interface material between the backside surface of the integrated circuit and the bottom surface of the heat spreader.

6. The method of claim 1, comprising attaching a heat sink to a top surface of the heat spreader.

* * * * *

UNITED STATES PATENT AND TRADEMARK OFFICE
CERTIFICATE OF CORRECTION

| | | |
|---|---|---|
| PATENT NO. | : 7,098,080 B2 | Page 1 of 1 |
| APPLICATION NO. | : 11/335347 | |
| DATED | : August 29, 2006 | |
| INVENTOR(S) | : Takeuchi | |

It is certified that error appears in the above-identified patent and that said Letters Patent is hereby corrected as shown below:

In column 1, at line 43, delete "layer." and insert --layers.--.

In column 1, at line 47, after "solder" insert --resist--.

Signed and Sealed this

Sixth Day of November, 2007

JON W. DUDAS
*Director of the United States Patent and Trademark Office*